(12) United States Patent
Blair (10) Patent No.: US 11,621,200 B2
(45) Date of Patent: Apr. 4, 2023

(54) METHOD FOR MAKING A BIPOLAR JUNCTION TRANSISTOR HAVING AN INTEGRATED SWITCHABLE SHORT

(71) Applicant: Peter Hugh Blair, Manchester (GB)

(72) Inventor: Peter Hugh Blair, Manchester (GB)

(73) Assignee: Diodes Incorporated, Plano, TX (US)

( * ) Notice: Subject to any disclaimer, the term of this patent is extended or adjusted under 35 U.S.C. 154(b) by 0 days.

(21) Appl. No.: 17/804,614

(22) Filed: May 31, 2022

(65) Prior Publication Data
US 2022/0336445 A1 Oct. 20, 2022

Related U.S. Application Data

(62) Division of application No. 17/391,114, filed on Aug. 2, 2021, now Pat. No. 11,393,811.

(60) Provisional application No. 63/060,164, filed on Aug. 3, 2020.

(51) Int. Cl.
*H01L 21/82* (2006.01)
*H01L 21/8249* (2006.01)
*H01L 27/06* (2006.01)
*H01L 21/04* (2006.01)

(52) U.S. Cl.
CPC ........ *H01L 21/8249* (2013.01); *H01L 21/041* (2013.01); *H01L 21/046* (2013.01); *H01L 21/0455* (2013.01); *H01L 27/0623* (2013.01)

(58) Field of Classification Search
CPC . H01L 21/041; H01L 21/0455; H01L 21/046; H01L 27/0623; H01L 21/8249; H01L 27/0705; H01L 27/0716; H01L 29/0692; H01L 29/7302; H01L 29/732
See application file for complete search history.

(56) References Cited

U.S. PATENT DOCUMENTS

| | | | | |
|---|---|---|---|---|
| 5,128,742 A * | 7/1992 | Kao | ..................... | H01L 29/0619 257/490 |
| 5,357,157 A * | 10/1994 | Throngnumchai | .. | H03K 17/063 327/427 |
| 6,008,585 A * | 12/1999 | Vilkinofsky | ....... | H03K 17/0822 307/10.8 |
| 2002/0125483 A1* | 9/2002 | Meyer | ................. | H01L 29/7395 257/E29.198 |
| 2010/0148214 A1* | 6/2010 | Terashima | .......... | H01L 27/0716 257/E29.197 |
| 2010/0301929 A1* | 12/2010 | Zhang | ..................... | H01L 25/18 327/566 |

* cited by examiner

*Primary Examiner* — Shouxiang Hu
(74) *Attorney, Agent, or Firm* — Steven A. Shaw (57) ABSTRACT

This application provides a process for making a circuit of a bipolar junction transistor (BJT). The switchable short in one implementation of the invention is formed in a semiconductor wafer. A collector region is formed in the semiconductor wafer and inside of the collector region, a first base region is formed. An emitter region is formed inside the base region to form the BJT. A drain region is also formed inside the base region adjacent to the emitter region. A gate is formed over a portion of the base region adjacent to the drain region and the emitter region. The gate is connected to the collection region.

10 Claims, 6 Drawing Sheets

METHOD FOR MAKING A BIPOLAR JUNCTION TRANSISTOR HAVING AN INTEGRATED SWITCHABLE SHORT

CROSS-REFERENCE TO RELATED APPLICATION

This application is a Divisional of and claims priority to U.S. patent application Ser. No. 17/391,114, filed Aug. 2, 2021, entitled "BIPOLAR JUNCTION TRANSISTOR HAVING AN INTEGRATED SWITCHABLE SHORT," which claims priority to U.S. Patent Provisional Application No. 63/060,164, filed on Aug. 3, 2020, entitled "BIPOLAR JUNCTION TRANSISTOR HAVING AN INTEGRATED SWITCHABLE EMITTER-BASED SHORT," The content of all the above-listed applications is incorporated by reference in their entirety herein for all purposes.

BACKGROUND OF INVENTION

The safe operating area (SOA) of a bipolar junction transistor (BJT), when used as a power switch in a common emitter configuration, is limited by the BVCEO (collector-emitter breakdown with base open), which due to the transistor current gain ($h_{FE}$), is less than the BVCBO (collector-base breakdown with emitter open). This puts BJTs at a disadvantage compared to MOSFETs of comparable dimension because the parasitic transistor gain of the MOSFETs is suppressed by the source-body short and therefore they are rated according to the BVCBO rating of the parasitic transistor (drain-body breakdown voltage). Attempts have been made to enhance the BJT breakdown voltage rating by increasing the thickness of the collector region and increase its resistivity at the expense of higher transistor series resistance, which is detrimental to the transistor performance in other aspects such as in power dissipation.

Alternatively, the circuit may add a resistive short between emitter and base of the BJT to boost its breakdown voltage to closer to BVCBO (so-called BVCES or BVCER). However, this necessarily suppresses the BJT current gain and therefore damages the 'on-function' of the BJT in terms of gain and saturation voltage. Furthermore, the use of an external short would also require the addition of another circuit element with its associated cost. Therefore, it is an objective of the present invention to increase the collector-emitter breakdown voltage of a BJT without damaging the 'on-function' of the BJT, and without incurring the cost of external circuit elements.

SUMMARY OF THE INVENTION

The Inventor substantially solved the above problem with the current BJT by integrating in the same BJT chip a switchable short that functions as an effective short between its emitter and base only when the BJT is in its off or blocking mode in order to boost its breakdown voltage; and is functionally removed from the circuitry when the BJT is at its on-state so its current gain and saturation voltage are not degraded.

One exemplary implementation of the invention is to build an MOS transistor in the same semiconductor chip as the BJT in such a way that the transistor is switchably controlled by the collector voltage of the BJT. Reverse bias voltage at the BJT collector turns on the MOS transistor thus effectively shorts the emitter and the base to siphon off a portion of the base current to lower the current gain and increase the breakdown voltage. Otherwise the transistor remains turned off so the gain and saturation voltage of the host BJT are maintained.

The effectiveness of the NMOS transistor as a switchable short is further enhanced with a integrated clamping diode disposed between the collector and the emitter of the BJT. The clamping diode is built in the same semiconductor chip as the BJT and is engineered to breakdown at a voltage higher than the native BJT BVCEO and lower than the avalanche breakdown voltage of the BJT collector-base junction, BVCBO. With an increasing collector-emitter voltage, the addition of a clamping diode effectively keeps the BJT from entering the snapback condition, which occurs when the collector-emitter leakage current (ICES) creates carriers by avalanche multiplication at the collector-base junction, that increase the effective supply of base current and turns on the BJT and causing a collapse in the sustained voltage. The clamping diode thus provides a safeguard to the safe operation area (SOA) to a collector voltage at its breakdown voltage higher than BVCEO and the snapback hold voltage.

TCAD simulation results and measurements taken from BJT devices embodying aspects of this invention agree that under steady-state and switching conditions higher voltage blocking capability is achieved without compromising the transistor gain and saturation voltage.

BRIEF DESCRIPTION OF DRAWINGS

All drawings in this paper are for illustrative purposes only and the elements in the drawings are not drawn to their true scale. The same reference numerals in different drawings refer to similar elements.

DEFINITION OF CERTAIN TERM

Terms used in this disclosure and claims generally have their ordinary meanings in the art within the context of the invention. Certain terms are defined below to provide additional guidance to the practitioners regarding the description of the invention. It will be appreciated that the same thing may be said in more than one way. Consequently, alternative language and synonyms may be used.

An integrated circuit chip is an electronic circuit formed on a piece of semiconducting material such as silicon, gallium nitride, silicon carbide, etc. In an exemplary embodiment of this invention, a semiconductor circuit chip comprises a bipolar junction transistor, a NMOS, and a clamping diode. The circuit components are connected internally by the doped regions in an epitaxial layer grown on top of a substrate of low electric resistance, and by metal on the surface of the chip. The doping of the doped regions is by ion implantation or gaseous deposition, and thermal diffusion.

A bipolar junction transistor uses both electrons and holes as charge carrier. It comprises a emitter, a base, and a collector, which in an exemplary embodiment disclosed in this application are formed by ion implantation in a silicon semiconductor chip. A MOSFET uses either electrons or holes as charge carrier. It comprises a source and a drain, which in an exemplary embodiment disclosed in this application are formed by ion implantation in a silicon semiconductor chip, and a gate element comprises polysilicon spaced from the semiconductor surface by a layer of silicon dioxide. The polysilicon gate may be substituted with a metal gate in other embodiments of this invention.

In order for an integrated circuit chip to function according to design, the chip needs to be supplied with proper voltages at the various circuit terminals. In the exemplary BJT, the collector, the base, and the emitter terminals are extended to the surface of the chip package for voltage supplies to be applied to the terminals. The voltage at the emitter terminal in this exemplary circuit chip is regarded as the reference voltage. The voltage values at other terminals and at internal circuit nodes are valued in reference to the voltage at the emitter terminal.

A switchable short element in a circuit is an implement that connects between two nodes of an electric circuit normally intended to be at different voltages to effect a low resistance so the voltages can be "switchably" made to be close to the same level. High resistance and low resistance are relative terms. In the exemplary circuit, the high resistance means the NMOS is off and the resistance between the drain and the source is in the range of 100 MΩ (eg. nA at 1V); when the NMOS is turned on by a collector voltage higher than the threshold voltage of the NMOS (about 30V in this example), the resistance between the drain and the source is of the order of 1 kΩ (eg. 0.5 mA at SV).

Reverse and forward bias describe the voltages being applied across a p-n junction. Forward bias facilitates a current flowing across the junction and reverse bias blocks the current flow.

In this paper, when two objects are described as adjacent to each other, it means that no intervening object similar to either object is located between the two objects; when one object is near, above, or below another object, the two objects may or may not physically contact the other object; when two objects are attached or affixed to each other, it is meant that some parts of the two objects are in physical contact.

DETAILED DESCRIPTION OF THE EMBODIMENTS

Figure 1:
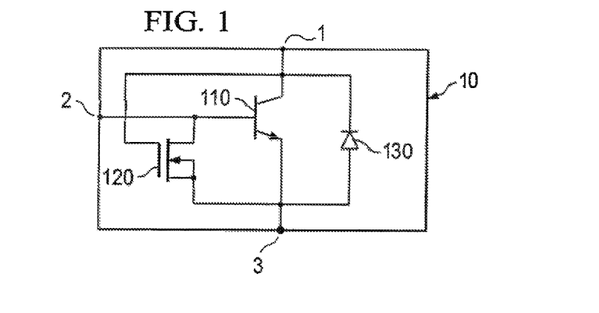
FIG. 1 depicts a schematic drawing of an integrated circuit chip, comprising a BJT, a NMOS, and a clamping diode.

FIG. 1 depicts an integrated circuit chip 10 that embodies certain aspects of this invention. The circuit comprises a combination of a bipolar junction transistor (BJT) 110, a metal oxide semiconductor field effect transistor (MOSFET) 120 and a clamping diode 130. The chip communicates to the outside through three pins—the emitter terminal pin 3, the base terminal pin 2, and the collector terminal pin 1. The BJT is a vertical device, which means the collector and the emitter are on opposite surface of the chip. The MOSFET is configured to be a surface device in which the current flows between the source and the drain very near the top surface of the chip.

In the integrated circuit depicted in FIG. 1, the gate of the NMOS 120 is connected to the collector node 1, the source is connected to the emitter at node 3 and drain is connected to the base at node 2. The clamping diode 130 is connected in parallel with the BJT, with the anode and the cathode connected respectively to the emitter at node 3 and to the collector at node 1.

As mentioned in a previous section of this paper, the safe operating area (SOA) of an conventional BJT when used as a power switch are limited by the BVCEO, which, due to the transistor gain $h_{FE}$, is less than the intrinsic breakdown voltage of the collector-base junction. In the integrated circuit 10, however, the SOA is substantially extended by two measures, according to aspects of this invention, by adding a switchable short in the form of a MOSFET 120 and a clamping diode 130 in the same circuit chip with the BJT. Specifically, the gate of the MOSFET 120 is internally biased by the collector of the BJT 110, which in the blocking mode may experience high voltages. In this configuration, MOSFET 120 turns on by the rising of the collector voltage before the collector base junction goes into full avalanche breakdown. As the turned on MOSFET 120 shunts a portion of the base current to the source, bypassing the base emitter junction, it effectively lowers the current gain hFE of the BJT 110, thus extends the SOA beyond BVCEO towards BVCES. In other embodiments of this invention, a depletion mode MOS transistor of an opposite polarity or an additional BJT may take the place of the enhancement mode NMOS 120.

In this exemplary circuit an on-chip n-channel enhancement mode MOSFET switch is formed within the npn BJT base region which turns on to effect an on-chip short between emitter and base. The gate is implemented by using a layer of polysilicon or alternatively a top metal layer. The voltage that drives the MOSFET gate is derived internally from the BJT collector. This arrangement effects the short with minimal delay and avoids the need for an external bias supply. An alternative embodiment is to place a depletion mode p-MOSFET within the collector region between the BJT base diffusion and a supplemental BJT base region that is contacted to the BJT emitter. The gate potential may be derived from the base or emitter potential such that the p-channel forms when the collector potential rises above the p-MOSFET threshold voltage.

Because in the n-MOSFET implementation the channel region is isolated from the collector potential by the BJT collector-base junction, there is no tendency to limit the short at high collector bias, and no loss of ability to extend the breakdown voltage. The gate potential at the n-MOSFET 110 can be more positive than the BJT base potential to open the channel and create the resistive short. With just the BJT emitter, base, and collector external pins available, the gate derives its bias from the BJT collector potential, further enhancing the channel as collector potential increases.

In the case of the p-MOSFET implementation the gate potential can be more negative than the BJT collector potential to open the channel and create the resistive short. With just the BJT emitter, base, and collector external pins available, the gate derives its bias from either BJT base or BJT emitter potential, preferentially from BJT emitter potential as this is the most negatively potential. As in the case of n-MOSFET the gate further enhances the channel as collector potential increases but is limited by depletion. Another alternative embodiment is using a secondary BJT instead of a MOSFET.

A second measure to enhance the breakdown performance of the BJT 110 is to incorporate a diode 130 between the collector and the emitter away from the BJT collector-base junction. The diode 130 is engineered to breaks down at a voltage lower than the BVCES trigger voltage, with sufficient voltage margin to allow a reasonable current in breakdown without causing the BJT collector-base junction to breakdown. The added clamp diode allows the voltage rating to be set not by the collector-emitter snap back hold voltage but by the clamp diode breakdown voltage which, by design, is higher than the snap-back hold voltage. In this way, as the MOSFET 120 is not required to transport hole current in breakdown, it can be smaller than otherwise would be necessary were there not to be such a clamp diode 130.

The clamp diode 130 may be made by a number of means to achieve the desired breakdown characteristics. The preferential way is to use the existing BJT process flow by deploying an additional base region, separate from the BJT 110 base region, and connected to emitter. The clamp diode breakdown voltage may be reduced by either constraining the field between it and an doped guard ring region that is part of the BJT 110 termination structure, thereby achieving the critical field at a lower applied voltage; or by deploying a patterned additional base region that weakens the net doping such as to promote punch-through breakdown at a voltage lower than the avalanche breakdown; or by deploying an additional base region of a narrow dimension that weakens the total doping such as to promote punch-through breakdown at a voltage lower than the avalanche breakdown; or by arranging the junction radius of curvature to be tighter than that of the BJT collector-base junction.

Figure 2:
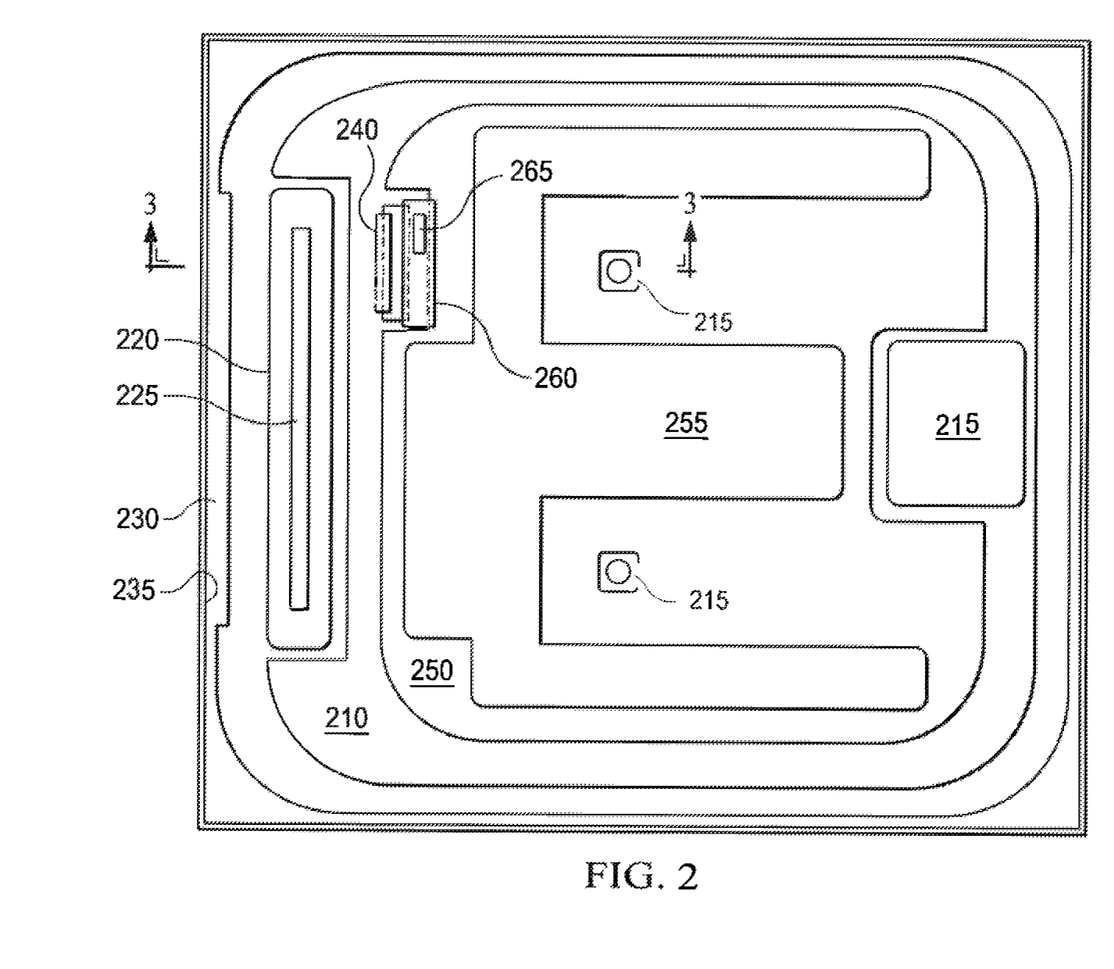
FIGS. 2 and 2A depict schematic drawings of the top view of an integrated circuit chip in FIG. 1.

FIG. 2 depicts a schematic drawing of the top view of an integrated circuit chip in FIG. 1 in terms of a contact mask overlaying the base mask, emitter mask, and the poly mask. FIG. 2 includes base regions of the BJT 210, and the anode region of the clamping diode 220; the guard ring region 230, the MOSFET drain region 240, and the BJT emitter region 250; the polysilicon gate 260; contacts to base region 215, to emitter region 255, to poly gate 265, to the clamping diode 225, and to guard ring 235.

Figure 2A:
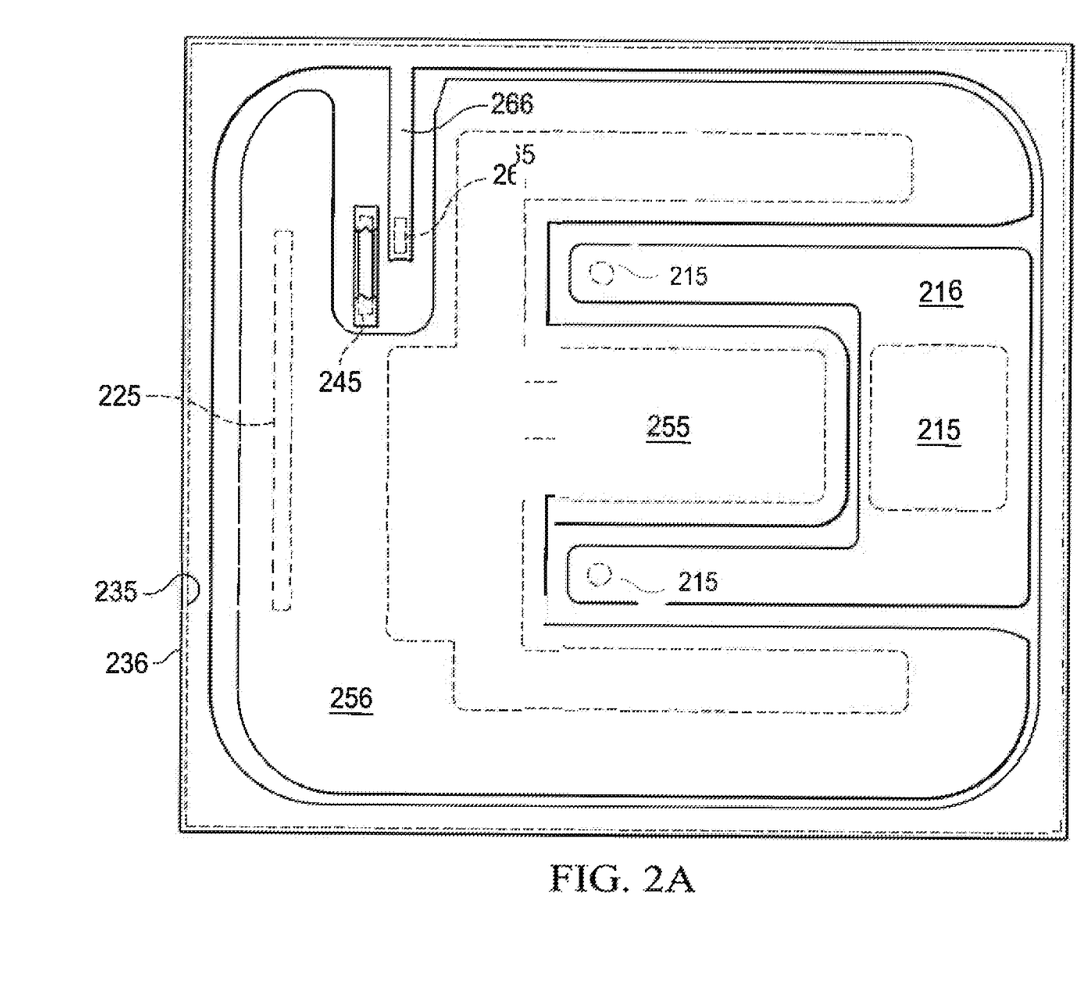

FIG. 2A depicts a schematic drawing of the top view of the integrated circuit chip in FIG. 1 in terms of a metal mask overlaying the contact mask. FIG. 2A includes contacts to base 215, to emitter 255, to the gate 265, to the clamping diode 225, to MOSFET body and drain 245, and to the guard ring 235. FIG. 2A also includes metal to the base region 216, to the emitter region and to the anode of the clamping diode 256, to the gate 266, and to the guard ring 236. In this example, the metal to gate 266 is an extension of the metal to guard ring 236.

Figure 3:
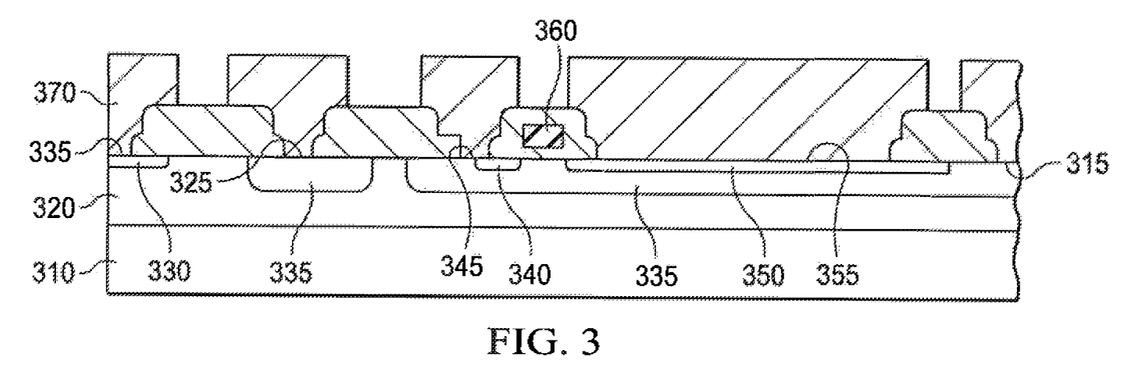
FIG. 3 depicts a schematic drawing of a cross section view of the integrated circuit chip along a cut out line 3-3 in FIGS. 2 and 2A.

FIG. 3 depicts the cross section view from the cut line 3-3 in FIGS. 2 and 2A. FIG. 3 depicts a substrate 310, which in this exemplary embodiment is a layer of single crystalline silicon heavily doped with n-type dopant such as phosphorous. The substrate 310 serves at the collector terminal of the BJT 110. Over the substrate is a relatively lightly doped n type epitaxial layer 320. The base region of the BJT and the anode region 335 of the clamping diode are formed in the epitaxial layer 320 through ion implant and thermal diffusion.

FIG. 3 also depicts regions doped with n-type dopant, including the guard ring region 330, the drain of the MOSFET 340, and the emitter region of the BJT 350; the polysilicon gate electrode 360; and the contacts to various regions of the circuit—to the guard ring 335, to the anode of the clamping diode 325, to drain and body region of the MOSFET 345, to the emitter region of the BJT 355, and to the base of the BJT 315.

Figure 4:
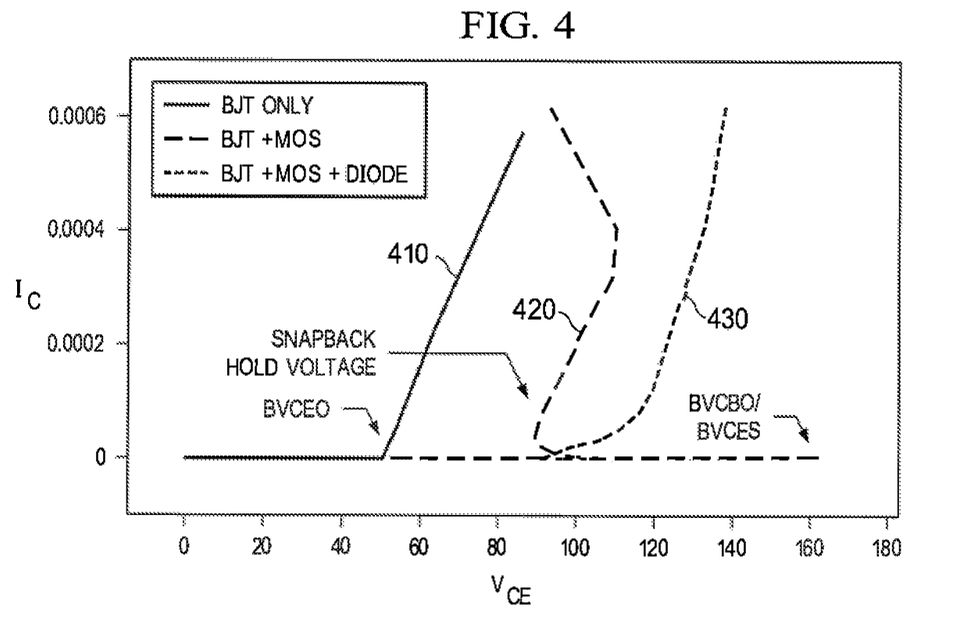
FIG. 4 depicts BJT collector currents versus collector voltage and the advantage of the implementation of the invention.

FIG. 4 depicts current versus voltage of three BJTs of different structure. The curve 410 at the far left represents a conventional BJT in an open base configuration; the middle curve 420 represents a BJT coupled internally with a MOS; the far right curve 430 represents a BJT coupled internally with a MOS and a clamping diode.

The BJT represented by curve 410 breaks down at collector to emitter voltage about 50V with the base open. The low breakdown is due to the injection of holes generated at the collector base into the base region and collected by the emitter. This current is amplified by the intrinsic hFE of the BJT in the form of electron current flows from the emitter to the collector. The positive feedback eventually causes current run away as depicted in FIG. 4.

Curve 420 depicts the characteristic of a BJT with a MOS coupled to it as depicted in FIG. 1 but without a clamping diode in the circuit. In this case, the breakdown voltage is seen to be pushed to that of the BVCBO or BVCES. However, as the current increase at the collector junction so does the hole current that enters the base and passes through the MOSFET. This current raises the voltage between the base and the emitter and thus causes an electron current to flow from the emitter to the collector where avalanche multiplication eventually causes current runaway and voltage to collapse to the snapback hold voltage. This secondary breakdown may be mitigated by increasing the MOSFET size thus lowering the channel resistance.

Curve 430 depicts a circuit in which a clamping diode is added. The diode is engineered to breakdown at a lower voltage than the base collector junction breakdown. Because the breakdown current does not enter the base region of the BJT, it does not initiate the snapback phenomenon.

Figure 5:
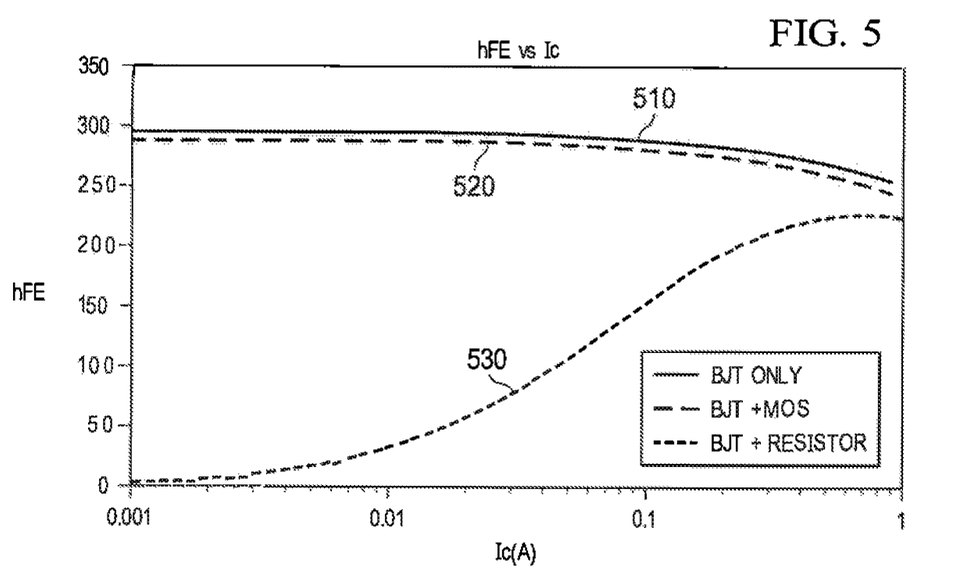
FIG. 5 depicts the current gain hFE of the BJT versus collector current show the advantages of the implementation of the invention.

FIG. 5 depicts the current gains ($h_{FE}$) of three circuits. Curve 510 represents a conventional BJT and the $h_{FE}$ is essentially constant through several orders of magnitude of collect current. Curve 520 represents a circuit where a MOSFET is incorporated into the BJT as depicted in FIG. 1. It is evident from FIG. 5 that with a switchable short such as a switchable MOSFET affixed to the BJT, the current gain of the BJT tracks its intrinsic value over a large range of operation without significant degradation. Curve 530 represents a fixed valued resistor affixed across the emitter and the base. It is evident that the $h_{FE}$ of the BIT is severely compromised by the resistor in a large range of the BJT operation.

Figure 6:
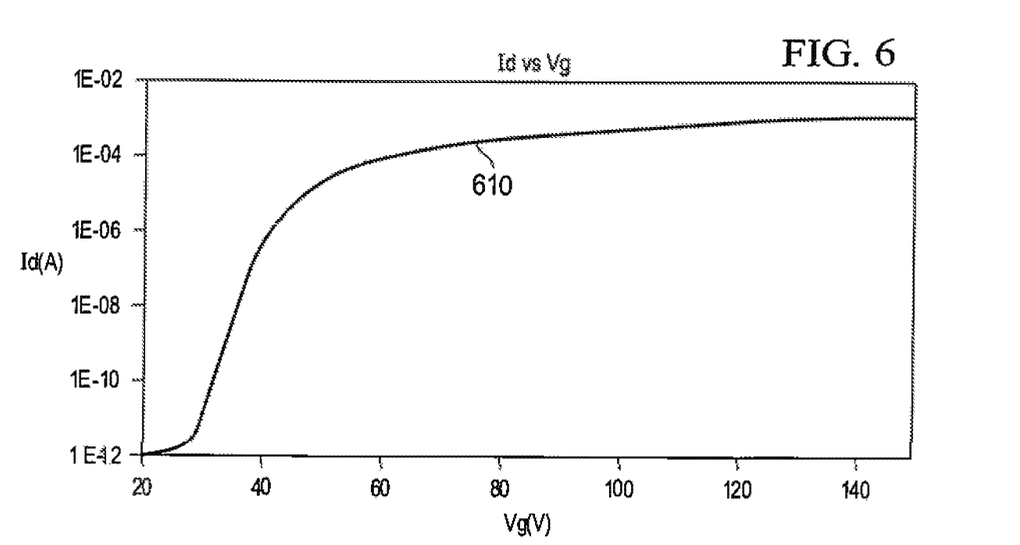
FIG. 6 depicts the drain current versus gate voltage of an exemplary NMOS in a circuit depicted in FIG. 1.

FIG. 6. depicts the turn-on characteristic of the MOSFET in the circuit in FIG. 1. The curve 610 depicts a MOSFET with a threshold voltage about 30V. The threshold voltage can be controlled by the selection of oxide thickness under the polysilicon gate and the doping concentration of the base region.

Figure 7:
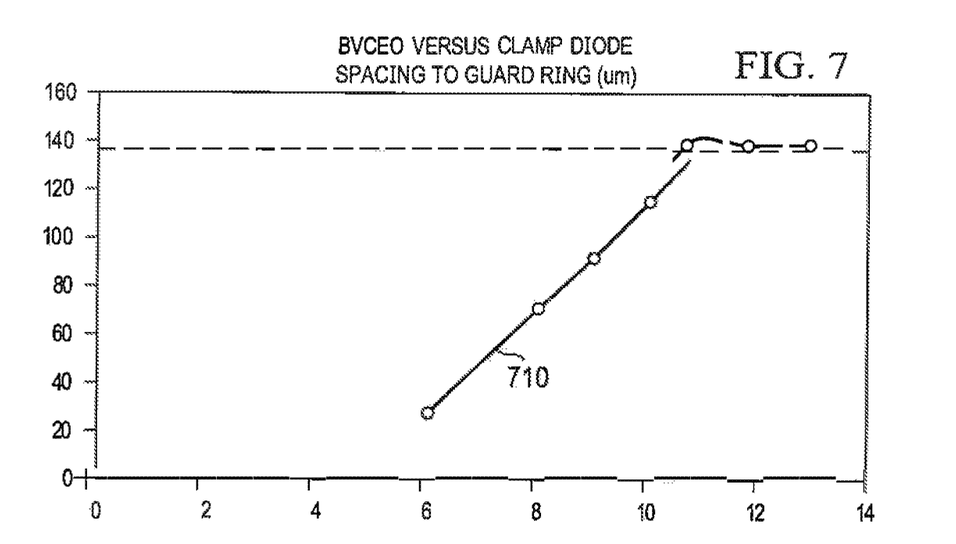
FIG. 7 depicts the breakdown voltage of an exemplary clamping diode as a function of the spacing between the diode and the guard ring.

FIG. 7 depicts the breakdown voltage of a clamping diode as a function of the space between the diode and a guard ring as depicted in FIGS. 2, and 3. Following curve 710, to select the proper spacing between the diode and the guard ring, optimal diode breakdown voltage can be readily obtained.

What is claimed is:
1. A process of making a circuit of a bipolar junction transistor (BJT) with a switchable short, comprising:
   providing a semiconductor wafer;
   forming in the semiconductor wafer a collector region;
   forming a first base region inside the collector region;

forming an emitter region inside the base region to form the BJT;

forming a drain region inside the base region adjacent to the emitter region;

forming a gate over a portion of the base region adjacent to the drain region and the emitter region; and connecting the gate to the collection region.

2. The process of claim 1, further comprising forming a contact opening exposing a top surface of the drain region and the base region.

3. The process of claim 1, further comprising forming a second base region separately from but concurrently with the forming of the first base region.

4. The process of claim 3, in which the gate, the source region, and the drain region combine to form a MOSFET.

5. The process of claim 4, further comprising biasing the gate with a voltage at the collector region to form an electrical short between the emitter region and the base region.

6. The process of claim 4, further comprising biasing the gate with a second voltage at the collector region to form an electrical open between the emitter region and the base region.

7. The process of claim 1, further comprising providing a semiconductor epi layer having a thickness for sustaining a first avalanche breakdown voltage between the base region and the collector region.

8. The process of claim 4, further comprising forming the second base region spaced from a guard ring region such that the second base having an avalanche breakdown voltage lower than the avalanche breakdown voltage between the first base region and the collector region.

9. The process of claim 8, in which the guard ring region is doped with the same dopant as that in the emitter.

10. The process of claim 9, further comprising electrically shorting the guard ring region and the collector region.

* * * * *